United States Patent [19]

Hébert et al.

[11] Patent Number: 5,567,634
[45] Date of Patent: Oct. 22, 1996

[54] METHOD OF FABRICATING SELF-ALIGNED CONTACT TRENCH DMOS TRANSISTORS

[75] Inventors: Francois Hébert; Sze-Hon Kwan, both of Sunnyvale; Izak Bencuya, San Jose, all of Calif.

[73] Assignee: National Semiconductor Corporation, Santa Clara, Calif.

[21] Appl. No.: 431,765

[22] Filed: May 1, 1995

[51] Int. Cl.$^6$ .................................................. H01L 21/265
[52] U.S. Cl. .................................................. 437/41; 437/40
[58] Field of Search ........................ 437/40 DM, 41 DM, 437/203; 257/330, 332, 333

[56] References Cited

U.S. PATENT DOCUMENTS

| | | | |
|---|---|---|---|
| 4,420,379 | 12/1983 | Tonnel | 257/332 |
| 4,774,198 | 9/1988 | Contiero et al. | 437/30 |
| 5,171,705 | 12/1992 | Choy | 437/41 |
| 5,182,222 | 1/1993 | Malhi et al. | 437/41 |
| 5,316,959 | 5/1994 | Kwan et al. | 437/40 |
| 5,341,011 | 8/1994 | Hshieh et al. | 257/330 |
| 5,387,528 | 2/1995 | Hutchings et al. | 437/203 |
| 5,405,794 | 4/1995 | Kim | 437/41 DM |
| 5,460,985 | 10/1995 | Tokura et al. | 437/40 DM |

*Primary Examiner*—Mary Wilczewski
*Assistant Examiner*—Brian K. Dutton
*Attorney, Agent, or Firm*—Limbach & Limbach LLP

[57] ABSTRACT

A method of fabricating a trench DMOS transistor structure results in the contact to the transistor's source and body being self-aligned to the trench. With a self-aligned contact, the distance from the edge of the source and body contact to the edge of the trench can be minimized. Thus, the distance between the trench edges can be reduced. As a result, the packing density of the transistor is increased dramatically. This gives rise to much improved performance in terms of low on-resistance and higher current drive capability. The process flow maximizes the height of the trench poly gate prior to formation of oxide spacers for the self-contact contact, thereby ensuring sufficient step height for the spacers.

1 Claim, 3 Drawing Sheets

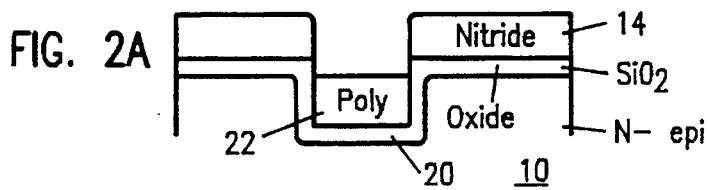
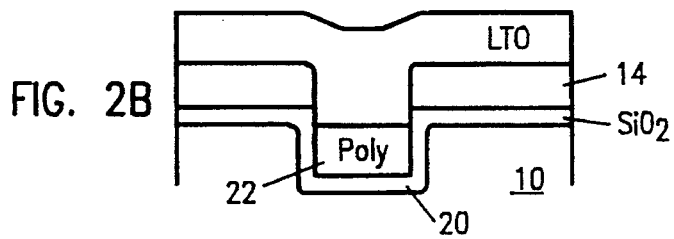
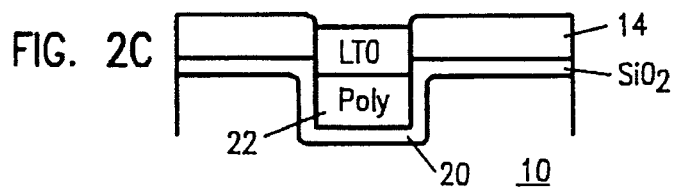
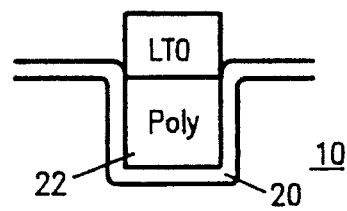
FIG. 3A
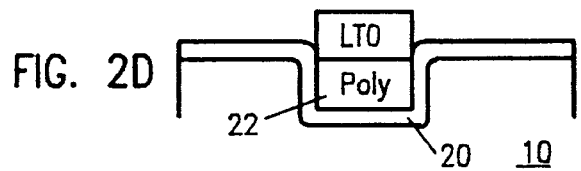
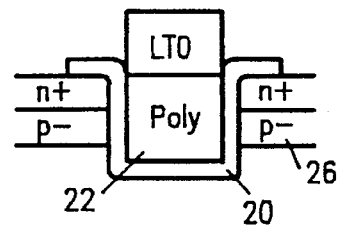
FIG. 3B
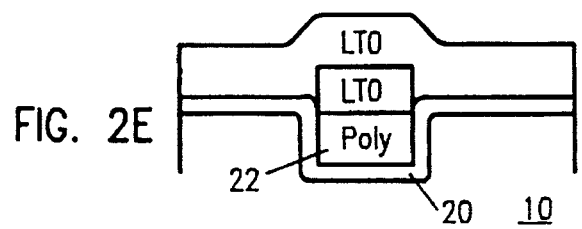
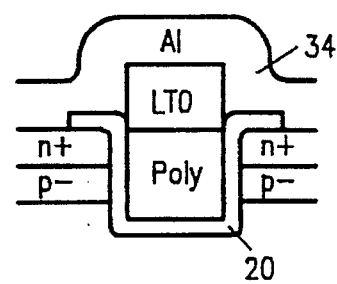
FIG. 3C
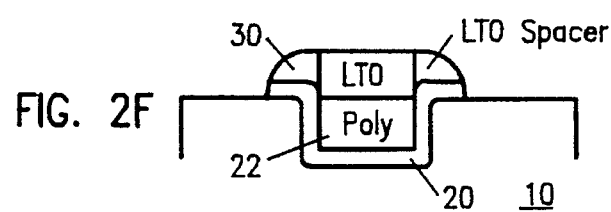

METHOD OF FABRICATING SELF-ALIGNED CONTACT TRENCH DMOS TRANSISTORS

RELATED APPLICATION

The present application is related to commonly-assigned U.S. patent application Ser. No. 08/431,782, filed May 1, 1995 by Sze-Hon Kwan and Izak Bencuya, titled Self-aligned Contact Trench DMOS Transistor Structure and Methods of Fabricating Same.

BACKGROUND OF THE INVENTION

1. Field of the Invention

The present invention relates to metal oxide semiconductor (MOS) devices and, in particular, to a method of fabricating trench, double diffused MOS (DMOS) transistors with the contact to the transistor's source and body self-aligned to the trench. The self-aligned contact reduces the distance between trench edges with a resulting increase in packing density and current driving capability and decrease in on-resistance.

2. Discussion of the Relevant Art

For power trench DMOS transistors, the on-resistance is minimized if the source and body region can be made the same size as the trench width. While the trench width can be made as small as 1 micron or less with current integrated circuit fabrication technology, the dimension of the source and body region is governed by the size of the source and body contact opening, typically from 2 to 5 microns, and the alignment tolerance, typically larger than 1 micron, from the edge of the contact to the edge of the trench.

U.S. Pat. No. 5,316,959, issued to Kwan, et al. on May 31, 1994, discloses a trench DMOS transistor which utilizes conventional lithographic technology for fabricating a contact to the source and body of a trench DMOS device. Specifically, the Kwan et al patent discloses a process flow that requires six masking steps for fabricating a trench DMOS device structure. These masking steps include a contact hole masking step in which portions of a borophosphosilicate glass (BPSG) layer overlying the trench structure are removed to form contact openings to the p+ regions and to the trench polysilicon. Thus, the Kwan et al approach suffers from the same mask alignment tolerance problems common to the prior art.

U.S. Pat. No. 5,171,705, issued to Choy on Dec. 15, 1992, discloses a high density DMOS transistor that utilizes a self-aligned structure in combination with a body contact region which overdopes the source region to minimize the number of required masking steps. The Choy structure uses dielectric spacers to eliminate the need for the contact masking step. While eliminating the contact mask, the Choy technique is not directed to a trench DMOS device.

It would be desirable to have available a method for providing a self-aligned contact trench DMOS transistor.

SUMMARY OF THE INVENTION

The present invention provides a method of fabricating trench DMOS transistor structures with the contact to the transistor's source and body self-aligned to the trench. With a self-aligned contact, the distance from the edge of the source and body contact to the edge of the trench can be minimized to between 0.1 to 0.3 microns using conventional integrated circuit fabrication processes. Therefore, the distance between the trench edges, which is the source and body region, can be reduced. As a result, the packing density of the transistor is increased dramatically. This gives rise to much improved device performance in terms of low on-resistance and higher current driving capability.

In accordance with the method of the invention, a layer of silicon dioxide is formed on an underlying layer of N-type epitaxial silicon. A layer of nitride is then formed on the $SiO_2$ layer, followed by formation of low temperature oxide (LTO) on the nitride, thus defining an oxide/nitride/oxide (ONO) sandwich. A trench mask is then defined on the surface of the LTO layer and the ONO layer is etched back to expose surface regions of the epi layer. The exposed epi is then etched to form trenches. After growing oxide on the exposed surfaces of the trenches, a layer of polysilicon is deposited to fill the trenches. The poly layer is then etched back to define the poly gates of the PMOS devices, the upper surface of each poly gate being higher than the upper surface of the nitride layer. The process then proceeds with removal of the LTO and definition of the self-aligned contact to the source and body of the device using polyoxide spacers grown from the gate material.

The above-described process flow maximizes the height of the trench poly gate to ensure a sufficient step height for the formation of the oxide spacers for the self-aligned contact.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 2A–2F are cross-sectional drawings illustrating the sequential steps of an alternate technique for forming oxide spacers in a process for fabricating self-aligned contact, trench DMOS transistor structures.

FIGS. 3A–3C are cross-sectional drawings illustrating another alternate technique for fabricating self-aligned contact, trench DMOS transistor structures.

DETAILED DESCRIPTION OF THE INVENTION

A basic process flow for fabricating an N-channel, self-aligned contact, trench DMOS transistor in accordance with the present invention is described in conjunction with FIGS. 1A–1F.

Figure 1A:
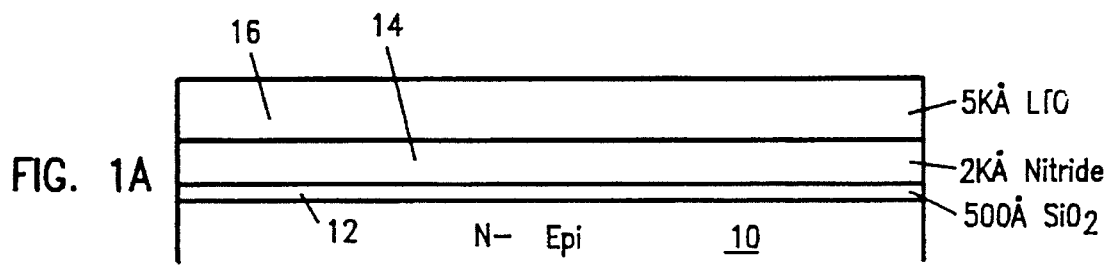
FIGS. 1A–1F are cross-sectional drawings illustrating the sequential steps of a process for fabricating self-aligned contact, trench DMOS transistor structures.

First, using a starting material of N– epitaxial silicon 10 on a N+ silicon substrate, a layer of stress relief oxide 12 approximately 500 Å thick is thermally grown. A layer of low pressure chemical vapor deposition (LPCVD) nitride 14 approximately 2000 Å thick and a layer of plasma enhanced chemical vapor deposition (PECVD) low temperature oxide (LTO) 16 approximately 5000 Å thick are then deposited on the stress relief oxide 12, resulting in an oxide-nitride-oxide (ONO) sandwich. The resulting structure is shown in FIG. 1A.

Figure 1B:
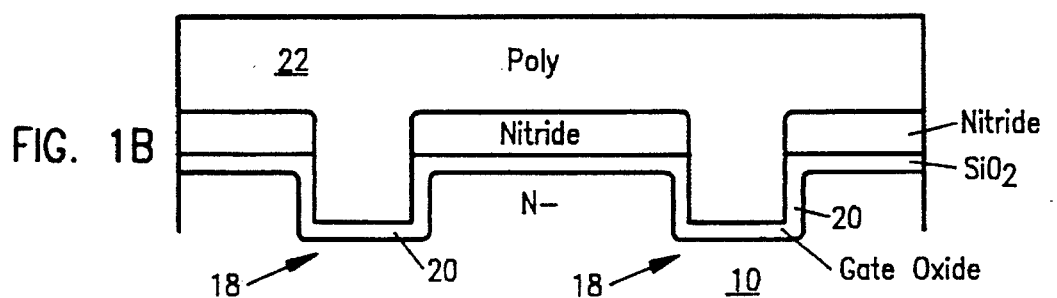

Next, in a first masking step (trench mask), trench areas are defined by conventional photolithographic techniques and the underlying ONO is etched to expose surface areas of the N– epi 10 under which the trenches are to be formed. After removal of the photoresist trench mask, the N– epi silicon 10 is etched to define trenches 18. This is followed by the removal of the 5000 Å LTO oxide 16, trench cleaning, and sacrificial oxide growth and removal, all in accordance with well-known, conventional fabrication techniques. Gate oxide 20 is then grown on the sidewalls of the trenches 18 followed by deposition of a layer of polysilicon 22 to fill the trenches 18 to provide for the gates of the trench DMOS transistors. The resulting structure is shown in FIG. 1B.

Figure 1C:
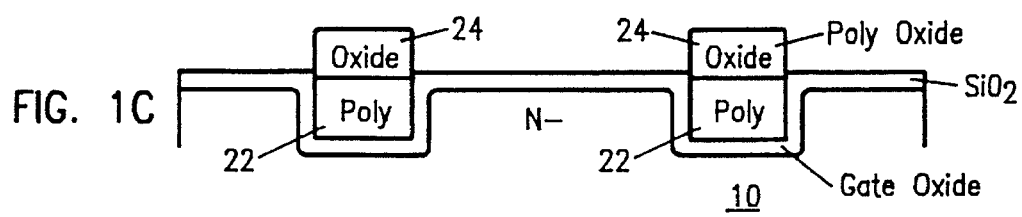

Next, in a second masking step (poly mask), the polysilicon 22 is doped and the poly mask is used to define the gate fingers or runners connecting the trench gate to the gate pad. The poly etch step delineates these gate fingers and gate runners only, while the polysilicon inside the trenches 18 is self-aligned to the trench edge and planarized to the nitride surface. Then, a polyoxide 24 is thermally grown over the poly gates 22 and the nitride 14 is removed. The resulting structure is shown in FIG. 1C.

Figure 1D:
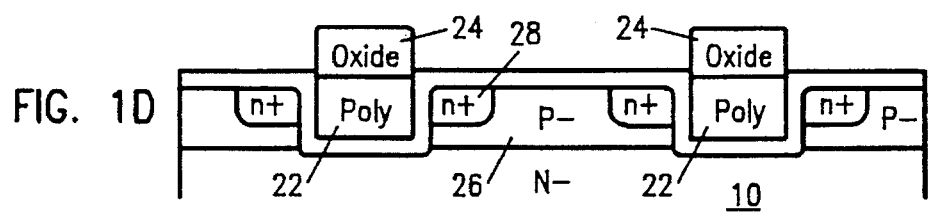

The P-body 26 of the DMOS transistor is then formed by blanket implanting boron and performing a drive-in diffusion. In a third masking step (N+ source mask), a photoresist implant mask is used to define the N+ source region 28 by arsenic or phosphorous implant and subsequent drive-in diffusion. The resulting structure is shown in FIG. 1D.

Figure 1E:
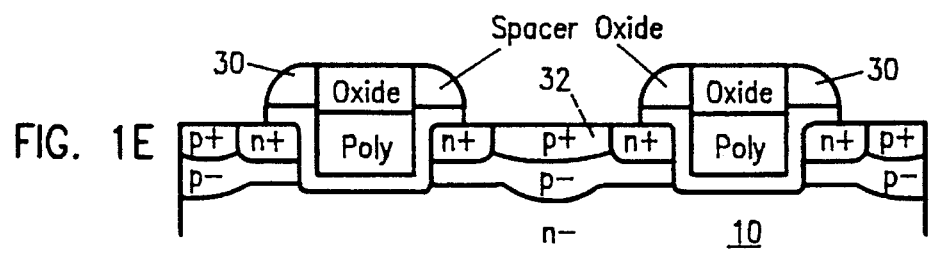

Next, oxide spacers 30 are formed to self-align the source and body contacts to the trenches 18. First, PECVD LTO oxide approximately 5000 Å thick is deposited and blanket dry-etched to form the oxide spacer 30 defining the separation between the source and body contact to the trench edge. Thus, in accordance with the invention, the source and body contact is self-aligned to the trench edge and no photolithographic masking and aligning are required. A blanket P+ implant of boron and an anneal step are then used to form the P+ body ohmic contact 32. The resulting structure is shown in FIG. 1E.

Figure 1F:
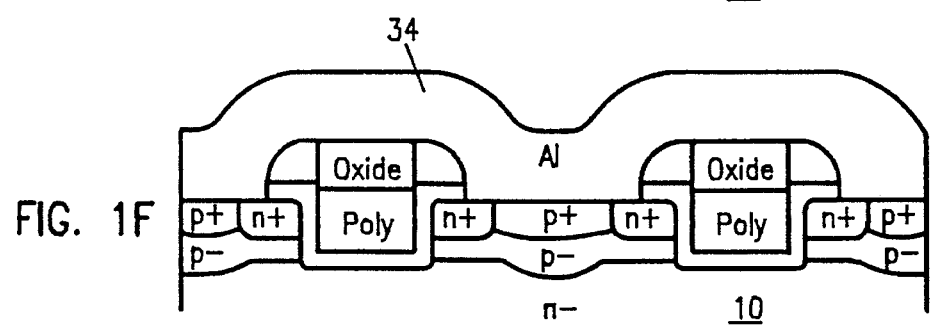

Next, a layer of aluminum is deposited to form the top layer metal 34. The resulting structure is shown is shown in FIG. 1F. In a fourth masking step (metal mask), a photoresist mask is used to delineate the top layer metal 34 for the source and gate area. A passivation layer, typically nitride or phosphosilicate glass (PSG), is then deposited. In a fifth masking step (pad mask), a photoresist mask is used to delineate the bonding pad areas for the source and gate. An alloy step is then used to improve the metal to silicon contact resistance. The substrate is then thinned down to the required thickness and the backside is metallized to form the backside drain contact.

The above process flow employs only five photolithographic masking steps. In situations where the design of the termination area might require thick field oxide, an active mask layer can be added prior to the trench mask.

An alternate process module for forming the oxide spacers 30 is illustrated in FIGS. 2A–2F. According to this alternate technique, after deposition of polysilicon 22 as shown in FIG. 1B of the above-described process flow, the polysilicon 22 is etched to the surface of the epitaxial layer 10 with the nitride 14 in place. The resulting structure is shown in FIG. 2A. Next, a PECVD LTO oxide layer approximately 5000 Å thick is deposited. The resulting structure is shown in FIG. 2B. The LTO oxide is then etched back to the nitride surface as shown in FIG. 2C. This is followed by a nitride strip utilizing hot phosphoric acid, which will not affect the remaining LTO or the underlying gate oxide. The resulting structure, shown in FIG. 2D, provides a well-defined step height on the LTO for formation of the spacers 30. A second layer of LTO is then deposited, as shown in FIG. 2E, and etched to define the LTO spacers 30, resulting in the structure shown in FIG. 2F. The process then proceeds to completion as described above.

In a second alternate process module, no spacers are utilized. Referring to FIG. 3A, the process proceeds in accordance with the just-described alternative module until the structure shown in FIG. 2D is realized. Note that FIGS. 3A and 2D are identical. The process then proceeds without the formation of oxide spacers with metal deposition as shown in FIG. 3B, relying on the step height of the etched PECVD LTO to insulate the poly gates 22 from the top layer metal 34. The process then continues to completion as described above.

Figure 4A:
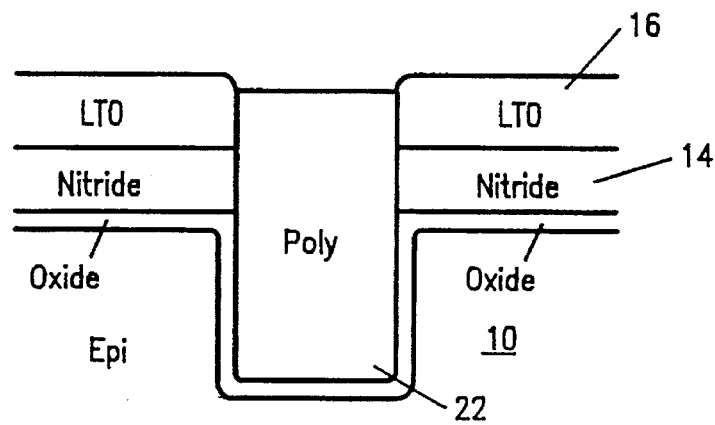
FIGS. 4A–4D are cross-sectional drawings illustrating a technique for forming oxide spacers in a process for fabricating self-aligned contact, trench DMOS transistors in accordance with the present invention.
Figure 4B:
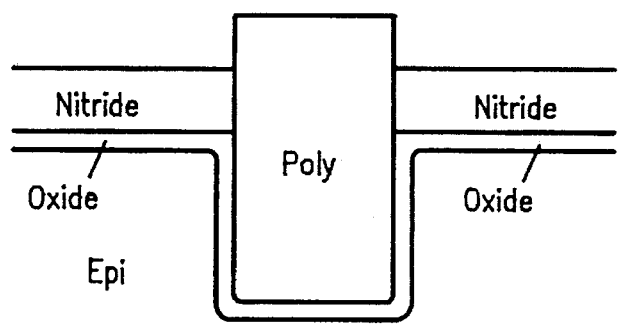
Figure 4C:
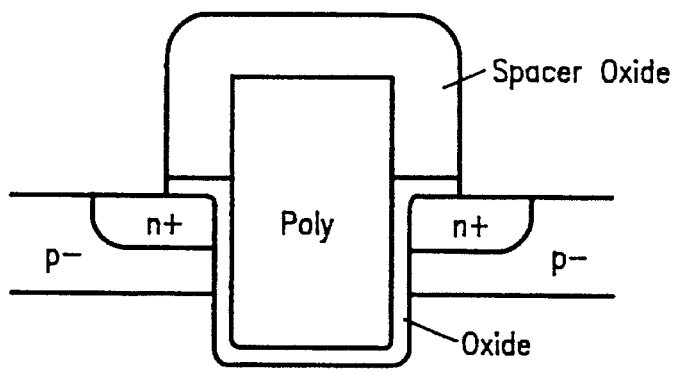

FIGS. 4A–4D show an alternate process module for fabricating the self-aligned contact structure. When this module is used, the process begins with the formation of the ONO sandwich, as shown in FIG. 1A. The trench mask is then used to define the trench areas on the upper surface of the N-epi layer 10. The trenches are then etched, lined with oxide and filled with polysilicon, all as described above. Next, however, rather than removing the 5000 Å LTO oxide 16, the LTO oxide 16 is left in place during the etchback of the polysilicon gate material 22, thereby providing proper poly step height to insure against undercutting the polysilicon surface to a level lower than the surface of the nitride layer 14. The LTO oxide 16 (FIG. 4B) and the nitride 14 are then removed, leaving maximized step height for polyoxidation of the poly gates, formation of the polyoxide spacers (FIG. 4C). The process then proceeds in the manner described above.

Figure 4D:
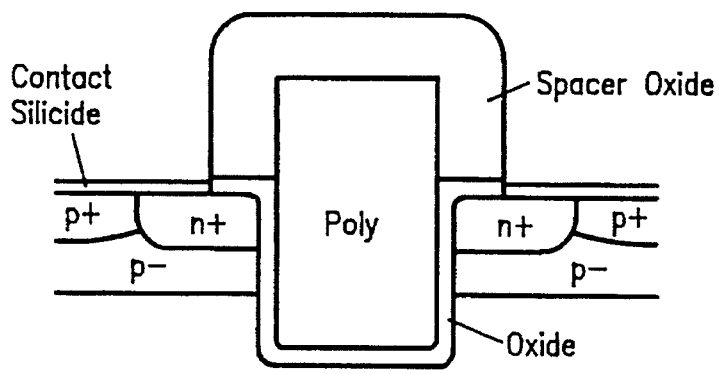

Optionally, as shown in FIG. 4D, the contact regions may be silicided prior to formation of the final metal layer to improve the ress\istivity of the contact. That is, a layer of refractory metal (e.g. Co, T. Ti) silicide can be formed, in accordance with techniques well known in the art, on the surface of the ohmic contact regions prior to deposition of the fianl aluminum contact layer.

The above device structure and various processes use an N– channel device for illustration. Those skilled in the art will appreciate that P-channel devices can also be constructed similarly by adopting the opposite material and dopant types.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of fabricating a trench DMOS transistor structure having a source and a body and a contact to the source and body of the transistor structure that is self-aligned to a trench formed to isolate the transistor structure, the method comprising:

forming a silicon dioxide layer on an underlying layer of N-type epitaxial silicon;

forming a nitride layer on the silicon dioxide layer, the nitride layer having an upper surface;

forming a low temperature oxide (LTO) layer on the nitride layer to define an LTO/nitride/silicon dioxide (ONO) sandwich;

defining a trench mask on the LTO layer to expose regions of the LTO layer;

etching the ONO sandwich to expose regions of the N-type epitaxial layer underlying the exposed regions of the LTO layer;

etching the exposed regions of the N-type epitaxial layer to define trenches therein;

forming silicon dioxide on exposed surfaces of the trenches;

depositing a polysilicon layer to fill the trenches;

etching the polysilicon layer to define polysilicon gate regions within the trenches, each polysilicon gate region having an upper surface that is higher than the upper surface of said nitride layer;

removing the LTO layer;

removing the nitride layer;

implanting P-dopant to form a region of P-type conductivity between the trenches;

defining an N+ source mask and using the N+ source mask to implant N-dopant to define N+ source regions adjacent to the trenches;

oxidizing the polysilicon gate regions to form oxide pads on the upper surface of the polysilicon gate regions and oxide spacers on exposed sidewalls of the polysilicon gate regions such that the oxide spacers extend over the N+ source regions;

implanting P-dopant to form P+ body ohmic contact regions between the N+ source regions; and forming a conductive layer over the oxide pads and the oxide spacers for contact with the P+ body ohmic contact regions.

* * * * *